United States Patent [19]
Klumperink et al.

[11] Patent Number: 5,006,815
[45] Date of Patent: Apr. 9, 1991

[54] LINEAR-GAIN AMPLIFIER ARRANGEMENT

[75] Inventors: Eric A. M. Klumperink, Lichtenvoorde; Evert Seevinck, Eindhoven, both of Netherlands

[73] Assignee: U.S. Philips Corporation, New York, N.Y.

[21] Appl. No.: 418,414

[22] Filed: Oct. 6, 1989

[30] Foreign Application Priority Data

Oct. 26, 1988 [NL] Netherlands ........................ 8802631

[51] Int. Cl.$^5$ ............................................. H03F 3/45
[52] U.S. Cl. ................................... 330/253; 330/254; 330/257
[58] Field of Search .............. 330/253, 254, 257, 288; 323/315, 316

[56] References Cited

U.S. PATENT DOCUMENTS 3,790,897  2/1974  Wheatley ............................ 330/261
4,459,555  7/1984  Jett, Jr. ............................ 330/257 X

FOREIGN PATENT DOCUMENTS 1519069  7/1978  United Kingdom .

OTHER PUBLICATIONS

Gilbert, "A New Wide-Band Amplifier Technique", *IEEE Journal of Solid-State Circuits*, vol. SC-3, No. 4, Dec. 1968, pp. 353-365.

Seevinck, "A Versatile CMOS Linear Transconductor/Square-Law Function Circuit," *IEEE Journal of Solid-State Circuits*, vol. SC-22, No. 3, Jun. 1967, pp. 366-377.

*Primary Examiner*—James B. Mullins
*Attorney, Agent, or Firm*—Bernard Franzblau

[57] ABSTRACT

A linear-gain amplifier arrangement comprises a current amplifying cell consisting of field-effect transistors and comprising a first (M1, M3) and a second (M2, M4current-mirror circuit whose respective input transistors (M1; M2) and output transistors (M3; M4) constitute a first and a second differential pair. The input transistors (M1; M2) have their drain electrodes connected to voltage-current converter (V/I) made up of field-effect transistors. The V/I converter supplies difference currents ($I_{in1}$; $I_{in2}$) which are square-law functions of the input voltage ($U_{in}$) to be amplified. The difference between these input currents is a linear function of the input voltage. When the transistors are operated in their saturation regions the difference between the output currents ($I_{out1}$; $I_{out2}$) is also a linear function of the input voltage ($U_{in}$). By adding a direct voltage ($V_c$) to the gate-source voltage of the input and output transistors or by adding a direct current ($I_c$) to the respective input currents ($I_{in1}$; $I_{in2}$) the gain can be varied without a change in bandwidth. When the arrangement is constructed as an integrated semiconductor circuit its gain can be made immune to temperature variations and tolerances in the fabrication process.

23 Claims, 2 Drawing Sheets

LINEAR-GAIN AMPLIFIER ARRANGEMENT

BACKGROUND OF THE INVENTION

The present invention relates to a linear-gain amplifier arrangement which comprises a current-amplifying cell comprising a first and a second current-mirror circuit. The first and second current-mirror circuits each comprise at least an input transistor and an output transistor to form a first and a second differential pair respectively. Means coupled to the current-amplifying cell are provided to define the gain of the amplifier arrangement.

An amplifier arrangement of this type, comprising bipolar transistors, is described, inter alia, in "A New Wide-Band Amplifier Technique" by B. Gilbert, IEEE Journal of Solid State Circuits, vol. SC-3, no. 4, Dec. 1968, pp. 353–365.

In the technology of electronically amplifying electric signals it is generally known that the bandwidth of an amplifier arrangement can be extended by applying negative feedback. However, a problem which arises when negative feedback is applied to amplifiers is the trade-off that is required between the bandwidth and the linearity of the transfer function. This is because the amplifier arrangement tends to become less stable as the bandwidth is extended by reason of the increased negative feedback. Conversely, open-loop amplifier arrangements which do not employ any form of negative feedback whatsoever have an excellent linearity without a trade-off in the bandwidth of the amplifier arrangement.

The bipolar amplifier arrangement defined in the opening paragraph is of the type without negative feedback and has a wide-band frequency response, a desired linear transfer characteristic, and an electronically controllable gain. These properties make the amplifier arrangement very suitable for use where bipolar amplifier arrangements with a linear gain at high frequencies beyond 100 MHz are required.

SUMMARY OF THE INVENTION

It is an object of the invention to provide a linear open loop amplifier arrangement of the type defined in the opening paragraph which is suitable for use in unipolar integrated circuits.

In accordance with the invention, this object is achieved in that the transistors are all of the field-effect type and are biassed to operate in their saturation region, the input transistors being connected to a voltage-to-current converter which is responsive to an input voltage to be applied thereby to supply difference currents which are related to said input voltage by a square-law function.

As is generally known, the current in the drain-source path of a field-effect transistor operating in the saturation region has a substantially square-law relationship with the gate-source voltage, so that the desired linear gain cannot be obtained by simply replacing the bipolar transistors in said prior-art amplifier arrangement by field-effect transistors. If, in accordance with the invention, the current amplifying cell comprising field-effect transistors is controlled by means of difference currents having a square-law relationship with the input voltage to be amplified, the difference between the currents in the drain-source paths of the input transistors, which are arranged as a differential pair, and consequently in the output transistors, which together with said input transistors are arranged in a current-mirror configuration, will be a linear function of the input voltage.

Voltage-current converters comprising field-effect transistors and supplying output currents having a square-law relationship with the input voltage are known per se and are described, inter alia, in "A Versatile CMOS Linear Transconductor/Square Law Function Circuit", by E. Seevinck and R. F. Wassenaar, IEEE Journal of Solid-State Circuits, vol. SC-22, no. 3, June 1987, pp. 366–377.

When, in accordance with the invention, the current-amplifying cell is controlled with input currents which are square-law functions of the input voltage, the gate-source voltages of the transistors will vary as linear functions of the difference between said input currents. It has now been found that, in an embodiment of the amplifier arrangement in accordance with the invention, the current gain of the amplifier arrangement can be varied by adding a suitable direct voltage to the gate-source voltage of the input transistors and the output transistors, respectively.

To this end, this embodiment of the invention is characterized in that the source electrodes of the input transistor are commoned and the source electrodes of the output transistors are commoned to form a first and second source terminal respectively, and the means for defining the gain of the amplifier arrangement comprises means connected to the first and the second source terminal to apply a direct voltage between said terminals.

In accordance with a further embodiment of the invention a controllable gain can be obtained in that the means for defining the gain of the amplifier arrangement are adapted to supply a variable direct voltage. A linear variation of this direct voltage results in a linear variation of the gain of the amplifier arrangement. This has the advantage that the gain can be increased by means of this direct voltage without a change in bandwidth because neither the transconductance nor the input capacitance of the amplifier arrangement are influenced. In contradistinction to the said bipolar amplifier arrangement, which has a constant bandwidth gain product when the gain is varied, the amplifier arrangement in accordance with the invention, which is equipped with field-effect transistors, has a constant bandwidth. Consequently, the amplifier arrangement in accordance with the invention can have a substantially higher bandwidth gain product than the prior-art bipolar amplifier arrangement.

If the amplifier arrangement in accordance with the invention is constructed as a single integrated circuit, the amplifier can be rendered immune to temperature variations and tolerances in the fabrication of the amplifier arrangement. To this end another embodiment of the invention is characterized in that the input transistors and the output transistors are biassed by means for applying a direct voltage, which means have fabrication process and temperature-dependence properties comparable to those of the means for applying the direct voltage for defining the gain of the amplifier arrangement.

As already stated in the foregoing, the use of a voltage to current converter (VI converter) in accordance with the invention causes the difference between the currents in the drain-source paths of the input transistors and the output transistors to vary as a linear function of the input voltage to be amplified. It has now been found that the gain of the amplifier arrangement in accordance with the invention, in a still further embodiment, can be defined by suitably influencing the transistor currents.

To this end, a still further embodiment of the amplifier arrangement in accordance with the invention is characterized in that the source electrodes of the input transistors and the output transistors are commoned to form a common first and second source terminal respectively, means being provided for making the currents in the first and the second source terminal equal to each other, the means for defining the gain of the amplifier arrangement comprising means connected to a source terminal for supplying a direct current. By making the sum of the currents in the drain source path of the input transistors and the output transistors respectively equal to one another, the required linearity of the voltage to current conversion in the output transistors is achieved. By applying an additional direct current it is possible to define the gain of the arrangement.

Still another embodiment of the amplifier arrangement in accordance with the invention is characterized in that the means for making the currents in the first and the second source terminal equal to one another comprise a current-mirror circuit having its input connected to the first source terminal and having its output connected to the second source terminal, and a current-reference circuit connected to the second source terminal to supply the direct current for defining the gain of the amplifier arrangement. For the current-mirror circuit and the current-reference circuit it is possible to employ state-of-the-art field-effect transistor circuits which are known per se and which are suitable for this purpose.

In order to provide variable gain, an embodiment of the invention is characterized in that the means for defining the gain of the amplifier arrangement are adapted to supply a variable direct current.

Similarly to the gain of the voltage-controlled embodiment of the amplifier arrangement, the gain of the current-controlled embodiment of the amplifier arrangement in accordance with the invention can be rendered independent of temperature variations and fabrication tolerances. To this end a further embodiment of the invention is characterized in that the transistors are biassed by means for applying a direct current, which means have fabrication process and temperature dependence properties comparable to those of the means for applying a direct current for defining the gain of the amplifier arrangement.

A preferred embodiment of the amplifier arrangement in accordance with the invention is characterized in that the transistors are metal-oxide-silicon transistors (MOS transistors) of the insulated-gate type, the amplifier arrangement being constructed as an integrated semiconductor circuit.

BRIEF DESCRIPTION OF THE DRAWINGS

The invention will now be described in more detail, by way of example, with reference to the accompanying drawings, which show diagrammatically two embodiments of the amplifier arrangement comprising MOS transistors.

DESCRIPTION OF THE PREFERRED EMBODIMENTS

Hereinafter it is assumed that the field-effect transistors are all of the MOS (Metal Oxide Silicon) type operating in their saturation regions and having their substrate connected to their source electrodes.

Figure 1A:
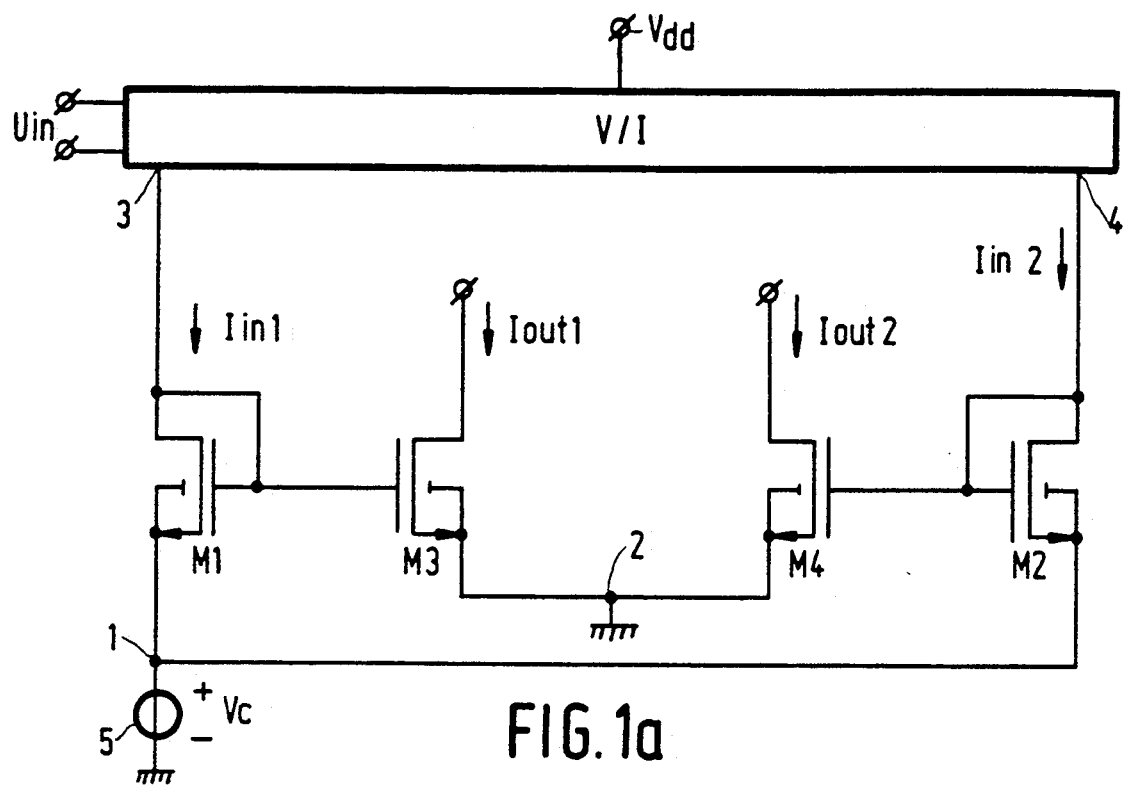
FIGS. 1a and 1b show a basic diagram of the amplifier arrangement in accordance with the invention, in which the gain can be controlled by means of a direct voltage.

FIG. 1a shows the basic diagram of an embodiment of the amplifier arrangement in accordance with the invention, in which the gain can be defined by means of a direct voltage. The arrangement comprises a current-amplifying cell comprising input transistors M1, M2 and output transistors M3, M4. The two input transistors M1, M2 are connected as diodes, i.e. the gate electrode of the respective transistor is connected to the associated drain electrode.

The respective source electrodes of the two input transistors M1, M2 are connected to a common first source terminal 1. The source electrodes of the output transistors M3, M4 are commoned to a second source terminal 2. Thus, the two input transistors and the output transistors in fact constitute a first and a second differential pair, respectively.

The inputs 3, 4 of the current-amplifying cell thus formed are the drain electrodes of the two input transistors (M1, M2) to which, in accordance with the invention, a voltage-to-current converter (VI converter) comprising MOS transistors is connected. The V/I converter supplies difference currents $I_{in1}$, $I_{in2}$ which are square-law functions of the input voltage $U_{in}$ to be amplified.

In the embodiment shown the first source terminal 1 is connected to the positive terminal of a direct voltage source 5 having an output voltage $V_c$ and having its negative terminal, like the second source terminal 2, connected to a power-supply terminal at a fixed voltage, in the present case the signal ground of the amplifier arrangement. The output currents in the drain-source paths of the output transistors M3, M4 are referenced $I_{out1}$ and $I_{out2}$ respectively. A current-voltage converter, known per se, can be connected to the drain electrodes of the two output transistors M3, M4 to convert the difference between the output currents into a suitable output voltage. In principle, the drain electrodes of the transistors M3, M4 may be connected to the $V_{dd}$ voltage supply of the arrangement by means of a resistor.

The amplifier arrangement operates as follows. The input currents are assumed to approximately comply with:

$$I_{in1} = K_v(V_{bias} + U_{in})^2 \tag{1a}$$

$$I_{in2} = K_v(V_{bias} - U_{in})^2 \tag{1b}$$

where:
$K_v$ = the transconductance parameter for transistors of the VI converter,
$V_{bias}$ = a bias voltage, and
$U_{in}$ = the input signal to be amplified.

It follows from (1a) and (1b) that the difference between the input currents is a linear function of $U_{in}$:

$$\Delta I_{in} = I_{in1} - I_{in2} = 4K_v V_{bias} U_{in} \tag{2}$$

As the difference between the input currents constitutes the signal to be amplified, equations (1a) and (1b) are expressed in terms of the difference between the input currents:

$$I_{in1,2} = I_{in0}\left[1 \pm \frac{\Delta I_{in}}{4 I_{in0}}\right]^2 \quad (3)$$

where the plus sign corresponds to $I_{in1}$ and the minus sign to $I_{in2}$ and where $I_{in0}$ is the input bias current, which for voltage-to-current converters in accordance with equation (1) complies with:

$$I_{in0} = K_v V^2_{bias} \quad (4)$$

For simplicity it is assumed that all of the input and output transistors are identical and that initially the drain current $I_d$ is equal to:

$$I_d = K_g(V_{gs} - V_{th})^2 \text{ for } V_{gs} > V_{th} \quad (5)$$

where:
  $K_g$ is the transconductance parameter for the input and output transistors,
  $V_{gs}$ is the associated gate-source voltage, and
  $V_{th}$ is the threshold voltage of the field-effect transistor.

The input currents in accordance with equation (3) applied to the input transistors will give rise to gate-source voltages $V_{gs1}$, $V_{gs2}$ for the respective input transistors M1, M2, which after substituting equation (3) in equation (5) and after further reduction of the result thus obtained comply with:

$$V_{gs1,2} = V_{th} + \sqrt{I_{in0}/K_g} \pm \frac{\Delta I_{in}}{4\sqrt{K_g I_{in0}}} \quad (6)$$

where the plus sign of the $\pm$ sign refers to $V_{gs1}$ and the minus sign to $V_{gs2}$.

It follows from equation (6) that the difference between the gate-source voltages of the transistors M1 and M2 is directly proportional to the difference $\Delta I_{in}$ between the input currents. In order to obtain a linear current gain this voltage difference should be converted linearly into a difference current of the output transistors M3, M4.

In accordance with the invention this is achieved in that the sum of the gate-source voltages of the transistors is maintained constant. It follows from equation (6) that the sum of $V_{gs1}$ and $V_{gs2}$ is already constant by applying input currents which are square-law functions of the input voltage to be amplified and is in fact dictated by the bias current $I_{in0}$. In accordance with the invention the linearity requirement for the output transistors M3 and M4 is met by adding a direct voltage $V_c$, which is independent of the signal current, to the gate-source voltages of the input transistors M1, M2. From FIG. 1 it now follows that:

$$V_{gs3} = V_{gs1} + V_c \quad (7a)$$

$$V_{gs4} = V_{gs2} + V_c \quad (7b)$$

where $V_{gs3}$ and $V_{gs4}$ are the gate-source voltages of the output transistors M3 and M4 respectively. Since, as already stated, the sum of $V_{gs1}$ and $V_{gs2}$ is constant, $V_{gs3} + V_{gs4}$ will also be constant, so that the linearity requirement is met.

By substitution of equation (6) in equation (7) and inserting this in equation (5) it follows that the output currents $I_{out1}$, $I_{out2}$ of the respective output transistor M3, M4 comply with:

$$I_{out1,2} = K_g\left[V_c + \sqrt{I_{in0}/K_g} \pm \frac{\Delta I_{in}}{4\sqrt{K_g I_{in0}}}\right]^2 \quad (8)$$

where the plus signa of the $\pm$ sign corresponds to $I_{out1}$ and the minus sign to $I_{out2}$.

When equation (8) is now applied this yields the difference output current $\Delta I_{out}$:

$$\Delta I_{out} = I_{out1} - I_{out2} = K_g \frac{V_c + \sqrt{I_{in0}/K_g}}{\sqrt{K_g I_{in0}}} \Delta I_{in} \quad (9)$$

The current gain $A_i$ of the amplifier arrangement follows from equation (9):

$$A_i = \frac{\Delta I_{out}}{\Delta I_{in}} = 1 + \frac{V_c}{\sqrt{I_{in0}/K_g}} \quad (10)$$

From equation (10) it follows that the gain of the amplifier arrangement can be defined by means of the voltage $V_c$. Obviously this is on the condition that the transistors are operated in their saturation regions.

It also follows from equation (10) that the gain $A_i$ is immune to temperature variations and fabrication tolerances if the bias current $I_{in0}$ is generated in a suitable manner. In conformity with equation (4) the following relationship applies:

$$I_{in0} = K_g V^2_{ino} \quad (11)$$

and substitution of equation (11) in equation (10) yields:

$$A_i = 1 + \frac{V_c}{V_{in0}}$$

where $V_{in0}$ is a direct voltage whose dependence on temperature variations and fabrication tolerances can be the same as that of the direct voltage $V_c$ for defining the gain. These direct voltages can be furnished by means of several state-of-the-art circuits which are known per se. By making $V_c$ variable an amplifier arrangement can be obtained whose gain is variable over a wide range.

Figure 1B:
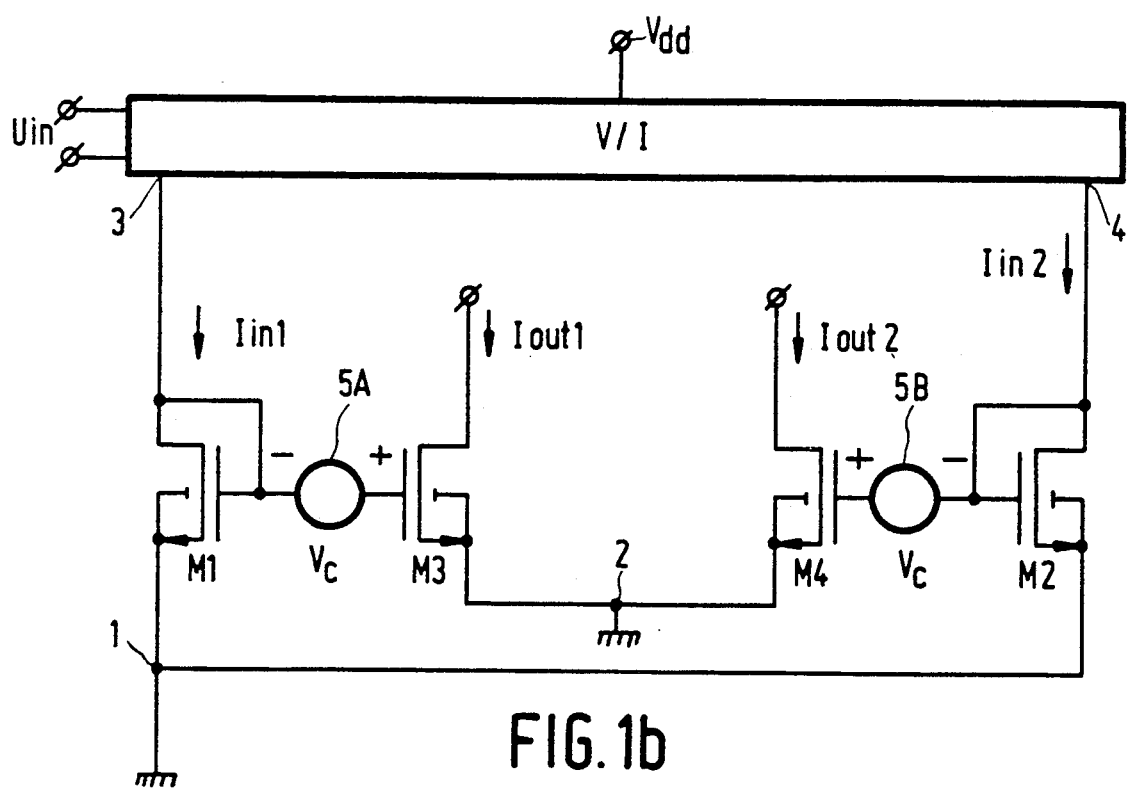

Equations (7a) and (7b) can also be met by means of the arrangement shown in FIG. 1b, which is substantially identical to the arrangement shown in FIG. 1a. However, in the arrangement shown in FIG. 1b the first and the second common source terminal 1 and 2 are both connected to signal ground and the direct-voltage source 5 is duplicated. The two voltage sources 5A and 5B have their negative terminals connected to the gate-drain nodes of the transistors M1 and M2, respectively and their positive terminals to the gates of the transistors M3 and M4, respectively. The arrangement in FIG. 1b otherwise operates in the same way as that in FIG. 1a.

Figure 2:
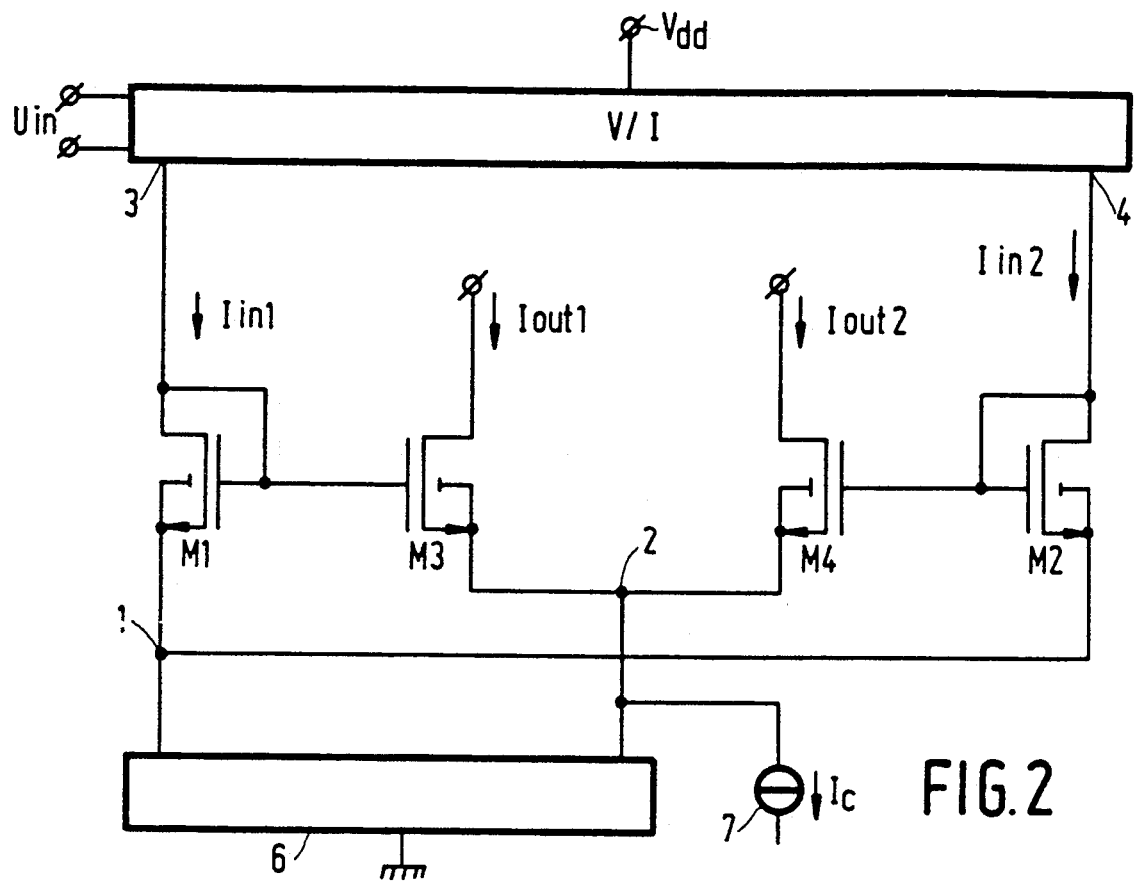
FIG. 2 shows a basic diagram of the amplifier arrangement in accordance with the invention, in which the gain can be controlled by means of a direct current.

Now reference is made to the circuit arrangement shown in FIG. 2. This circuit arrangement is substantially identical to those shown in FIGS. 1a and 1b, the difference being that an additional current-mirror circuit 6 has been added, which has its input connected to the first source terminal 1 and which has its output connected to the second source terminal 2. The common connection line of the current-mirror circuit 6 is connected to the signal ground of the amplifier arrangement. Further, a current reference element 7 is connected to the second source terminal 2 and is constructed as a current source which is known per se. In its simplest form the current-mirror circuit 6 is identical to, for example, a combination similar to that of the transistors M1 and M3, whose source electrodes are connected to signal ground.

The purpose of the use of an additional current-mirror circuit 6 and a current-reference circuit 7 may be explained as follows. The difference $\Delta I_{out}$ between the output current of the transistors M3, M4 may be represented as follows by conversion of equation (5):

$$\Delta I_{out} = \sqrt{2K_g} \sqrt{(I_{out1} + I_{out2}) - \sqrt{\tfrac{1}{2} K_g(V_{gs1} - V_{gs2})^2} (V_{gs1} - V_{gs2})} \quad (12)$$

If the sum of the output currents is made to depend on the difference between the gate-source voltage of the first transistor M1 and the second transistor M2 in conformity with a suitable square-law function the voltage-to-current conversion can be linearised.

Substitution of the difference current $\Delta I_{in}$ in conformity with equation (6) in equation (3) yields:

$$I_{in1} + I_{in2} = 2I_{in0} + \tfrac{1}{2}K_g(V_{gs1} - V_{gs2})^2 \quad (13)$$

As a result of the use of the current-mirror circuit 6 the sum of the input currents $I_{in1}$ and $I_{in2}$, as available in the first source terminal 1 will be added to the direct current Ic from the current-reference element 7, so that the sum of the output currents $I_{out1}$ and $I_{out2}$ in the second source terminal 2 complies with:

$$I_{out1} + I_{out2} = I_c + 2I_{in0} - \tfrac{1}{2}K_g(V_{gs1} - V_{gs2})^2 \quad (14)$$

Substitution of equation (14) in equation (12) and inserting the result thus obtained for the gate-source voltages of the transistors M1 and M2 in equation (6) shows that the current gain of this arrangement complies with:

$$A_i = \frac{\Delta I_{out}}{\Delta I_{in}} = \sqrt{1 + \frac{I_c}{2 I_{in0}}} \quad (15)$$

Consequently, a further linear current amplifier arrangement is obtained whose gain can be controlled by means of the direct current $I_c$. By making the current-reference element 7 adjustable the gain $A_i$ can be controlled over a wide range. Again the bandwidth of the arrangement is not affected by the control current $I_c$.

If the direct current $I_c$ and the bias current $I_{in0}$ are supplied by corresponding circuits the gain $A_i$ can again be rendered independent of temperature variations and tolerances in the fabrication process of the amplifier arrangement.

It will follow from equation (9) and (15) that the gain $A_i = 1$ if $V_c$ and $I_c$ respectively are zero. The arrangements shown in FIGS. 1a and 1b and 2 then operate as a pair of current-mirrors having a bandwidth which is mainly dictated by the transconductance of the input transistors M1, M2 and the capacitance at the input terminals. The gain can be changed by means of $V_c$ or $I_c$ without a change of said bandwidth because the transconductance of the input transistors and the capacitance at the input terminals is not altered.

Experimental results obtained by means of circuits comprising MOS transistor arrays of the type CA3600E show that the bandwidth/gain product of the amplifier arrangement in accordance with the invention for small signals is at least eight times as large as that of the prior-art current-mirror using similar MOS field-effect transistors.

It is obvious that the invention is not limited to embodiments comprising N-channel MOS transistors as shown, but that the arrangement can also be constructed by means of P channel field-effect transistors, if required with the use of additional transistors to increase the signal voltage swing of the output transistors, bias resistors etc. The control voltage $V_c$ or the control current $I_c$ can be supplied by separate auxiliary circuits, for example, when the arrangement in accordance with the invention is employed for automatic gain control in receivers.

Figure 3:
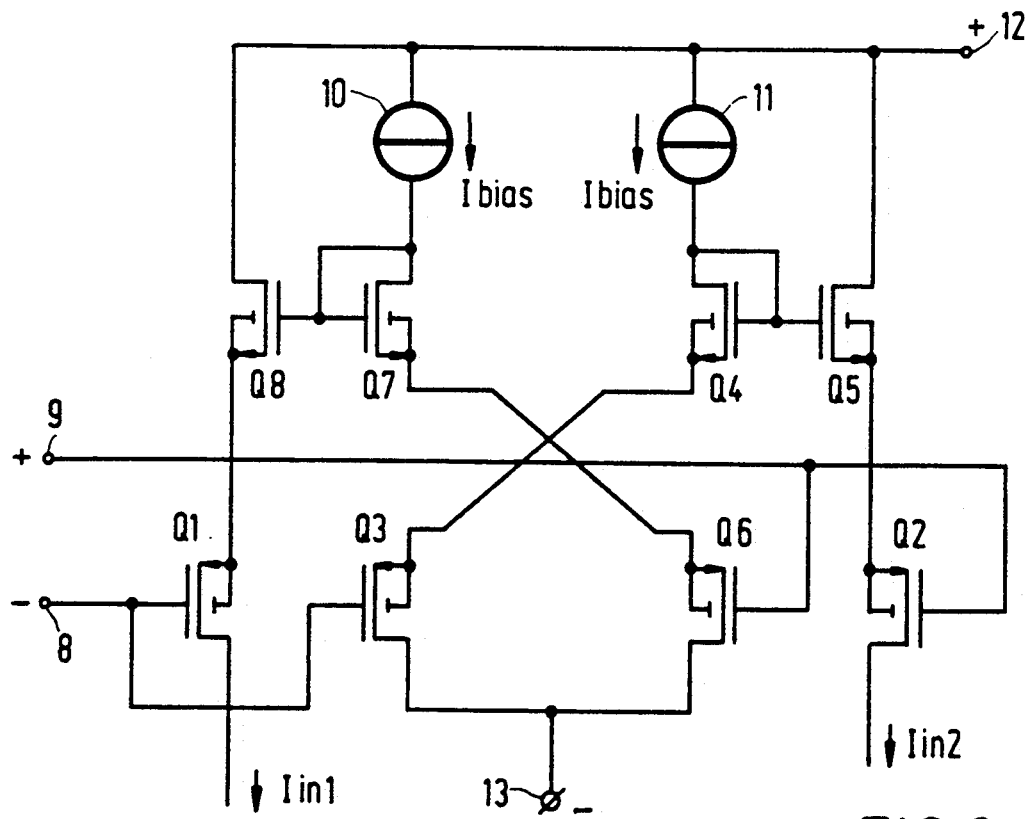
FIG. 3 shows a basic diagram of a prior-art voltage-to-current converter for use in the arrangements shown in FIGS. 1 and 2.

FIG. 3 shows a voltage to current converter which is known from the said publication by E. Seevinck et al, comprising field-effect transistors and suitable for use in the arrangement in accordance with the invention.

The arrangement basically comprises a matched pair of P-channel transistors Q1 and Q2 whose gate electrodes are connected to input terminals 8, 9 for the application of the input voltage $U_{in}$ to be amplified.

For biasing the two transistors Q1 and Q2 the transistor circuits Q3, Q4, Q5 and Q6, Q7, Q8 respectively are provided, which each constitute an N-channel current-mirror pair Q4, Q5 and Q7, Q8, respectively, which via the respective P-channel transistors Q3 and Q6 supply a bias voltage $V_{bias}$ whose value can be varied by means of the bias current $I_{bias}$ applied to the inputs of said current-mirror pairs by the current-reference elements 10, 11.

Now the currents $I_{in1}$ and $I_{in2}$ are available at the respective drain electrodes of the transistors Q1 and Q2, which currents are in a square-law relationship with the input voltage $U_{in}$ in conformity with equations (1a) and (1b). The circuit further comprises power supply terminals 12, 13 for applying a suitable supply voltage.

It will be evident that the invention is not limited to arrangements employing the voltage to current converter described herein or the inverse version thereof, but that other suitable voltage to current converters which are known per se may be employed, for example as described in "A Class of Analog CMOS Circuits Based on the Square Law Characteristic of a MOS Transistor in Saturation", by K. Bult and H. Wallinga, IEEE Journal of Solid-State Circuits, vol. SC-22, no. 3, June 1987, pp. 357–365; "Design of Linear CMOS Transconductance Elements" by A. Nedungadi and T. R. Viswanathan, IEEE Trans. Circuits and Systems, vol. CAS-31, no. 10, Oct. 1984, pp. 891–894; "CMOS Voltage-to-Current Transducers" by R. R. Torrance et al, IEEE Trans. Circuits and Systems, vol. CAS-32, no. 11, Nov. 1985, pp. 1097–1104, and "CMOS Transconductance Element" by T. R. Viswanathan, Proc. IEEE, vol. 74, no. 1, Jan. 1986, pp. 222–224.

We claim:

1. A linear-gain amplifier arrangement which comprises: a current-amplifying cell comprising a first and a second current-mirror circuit of which each comprises at least an input transistor and an output transistor to form a first and a second differential pair, respectively, and means coupled to the current-amplifying cell for defining the gain of the amplifier arrangement, wherein the transistors are all of the field-effect type and are biased to operate in their saturation regions, the input transistors being connected to a voltage-to-current converter which is responsive to an applied input voltage so as to supply difference currents which are related to said input voltage by a square-law function.

2. An amplifier arrangement as claimed in claim 1, wherein the source electrodes of the input transistors are commoned and source electrodes of the output transistors are commoned to form a first and second source terminal, respectively, the means for defining the gain of the amplifier arrangement comprising means connected to the first and the second source terminal for applying a direct voltage between said terminals.

3. An amplifier arrangement as claimed in claim 2, wherein the second source terminal is connected directly to the signal ground of the amplifier arrangement and the first source terminal is connected to said signal earth via the means for defining the gain.

4. An amplifier arrangement as claimed in claim 2, wherein the means for defining the gain of arrangement supply a variable direct voltage.

5. An amplifier arrangement as claimed in claim 2, characterized in that the input transistors and the output transistors are biased by means for applying a direct voltage, which means have fabrication process and temperature-dependence properties comparable to those of the means for applying the direct voltage for defining the gain of the amplifier arrangement.

6. An amplifier arrangement as claimed in claim 1, wherein the source electrodes of the input and the output transistors are connected to a power-supply terminal, and the means for defining the gain of the amplifier arrangement comprise means, connected between the gate of the input transistor and the gate of the output transistor of the first and the second current mirror, respectively, for applying a direct voltage between said gates.

7. An amplifier arrangement as claimed in claim 6 wherein the input transistors and the output transistors are biassed by means for applying a direct voltage, which means have fabrication process and temperature-dependence properties comparable to those of the means for applying the direct voltage for defining the gain of the amplifier arrangement.

8. An amplifier arrangement as claimed in claim 6, characterized in that the means for defining the gain of the amplifier arrangement supply a variable direct voltage.

9. An amplifier arrangement as claimed in claim 1, wherein the source electrodes of the input transistors and the output transistors are commoned to form a first and second source terminal, respectively, and means for making the currents in the first and the second source terminal equal to each other, and wherein the means for defining the gain of the amplifier arrangement comprises means, connected to a source terminal, for supplying a direct current.

10. An amplifier arrangement as claimed in claim 9, wherein the means for making the currents in the first and the second source terminal equal to one another comprise a current-mirror circuit having its input connected to the first source terminal and having its output connected to the second source terminal, and said direct current supplying means includes a current-reference circuit connected to the second source terminal to supply the direct current for defining the gain of the amplifier arrangement.

11. An amplifier arrangement as claimed in claim 10 wherein the means for defining the gain of the amplifier arrangement supply a variable direct current.

12. An amplifier arrangement as claimed in claim 10, characterized in that the transistors are biassed by means for applying a direct current, which means have fabrication process and temperature-dependence properties comparable to those of the means for supplying direct current for defining the gain of the amplifier arrangement.

13. An amplifier arrangement as claimed in claim 9 wherein the transistors are biassed by means for applying a direct current, which means have fabrication process and temperature-dependence properties comparable to those of the means for supplying a direct current for defining the gain of the amplifier arrangement.

14. An amplifier arrangement as claimed in claim 9, characterized in that the means for defining the gain of the amplifier arrangement supply a variable direct current.

15. An amplifier arrangement as claimed in claim 1, wherein the transistors are all of the insulated-gate type, the amplifier arrangement comprising an integrated semiconductor circuit.

16. A linear-gain amplifier comprising:
a first and a second current mirror circuit each of which comprises a diode-connected input field effect transistor and an output field effect transistor,
means connecting the input transistors to form a first differential pair and the output transistors to form a second differential pair wherein each of said transistors is biased to operate in its saturation region,
a voltage-to-current converter including first and second outputs and having an input for receiving an input voltage to be amplified, said voltage-to-current converter being responsive to said input voltage to supply difference currents to its first and second outputs which are related to said input voltage as a square-law function,
means connecting the input transistors to respective first and second outputs of the voltage-to-current converter, and
means coupled to at least one said differential pair for defining the gain of the amplifier.

17. An amplifier as claimed in claim 16, wherein said amplifier gain defining means comprise a source of DC voltage coupled to given ones of said transistors so as to add a DC voltage to the gate-source voltages of said input and output transistors.

18. An amplifier as claimed in claim 16, wherein the source electrodes of the input transistors are connected in common to form a first node and the source electrodes of the output transistors are connected in common to form a second node,
a further current mirror circuit having an input connected to said first node and an output connected to said second node, and wherein
said amplifier gain defining means comprises a DC current source coupled to the second node.

19. An amplifier as claimed in claim 16 wherein first main electrodes of the input transistors are connected in common to form a first node and first main electrodes of the output transistors are connected in common to form a second node, said amplifier gain defining means comprising means for supplying a DC current to one of said nodes, and wherein the transistors are biased into the saturation region by means for applying a bias current to said transistors, said bias current applying means and said DC current supplying means being fabricated as part of a common integrated circuit so that amplifier gain is relatively independent of variations in temperature and in the integrated circuit fabrication process.

20. An amplifier as claimed in claim 16 wherein first main electrodes of the input transistors are connected in common to form a first node and first main electrodes of the output transistors are connected in common to form a second node, and said gain defining means comprise means for applying a DC voltage to said first and second nodes.

21. An amplifier as claimed in claim 20 wherein the input transistors and the output transistors are biased into the saturation region by means for applying a bias voltage to said transistors, said bias voltage applying means and said DC voltage applying means being fabricated as part of a common integrated circuit so that amplifier gain is relatively independent of variations in temperature and in the integrated circuit fabrication process.

22. An amplifier as claimed in claim 16 further comprising means coupled to said input and output transistors for making the sum of the currents in the input transistors equal to the sum of the currents in the output transistors.

23. An amplifier as claimed in claim 16 wherein said gain defining means comprise means for applying a common DC voltage to gate-source circuits of said input transistors whereby the sum of the gate-source voltages of the transistors is maintained constant.

* * * * *